US011810807B2

United States Patent
Kigawa et al.

(10) Patent No.: US 11,810,807 B2
(45) Date of Patent: Nov. 7, 2023

(54) PROCESSING APPARATUS CONFIGURED FOR PROCESSING WAFERS CONTINUOUSLY UNDER DIFFERENT PROCESSING CONDITIONS

(71) Applicant: DISCO CORPORATION, Tokyo (JP)

(72) Inventors: Akiko Kigawa, Tokyo (JP); Nobuyuki Fukushi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/404,022

(22) Filed: Aug. 17, 2021

(65) Prior Publication Data

US 2022/0068685 A1 Mar. 3, 2022

(30) Foreign Application Priority Data

Aug. 31, 2020 (JP) ................. 2020-145559

(51) Int. Cl.
*H01L 21/677* (2006.01)
*B65G 1/04* (2006.01)
*H01L 21/687* (2006.01)

(52) U.S. Cl.
CPC ...... *H01L 21/67748* (2013.01); *B65G 1/0485* (2013.01); *H01L 21/67778* (2013.01); *H01L 21/68771* (2013.01); *B65G 2201/0297* (2013.01)

(58) Field of Classification Search
CPC ......... H01L 21/67748; H01L 21/67778; H01L 21/68771; B65G 1/0485; B65G 2201/0297
See application file for complete search history.

(56) References Cited

U.S. PATENT DOCUMENTS

| | | | | |
|---|---|---|---|---|
| 5,803,932 | A | * | 9/1998 | Akimoto ........... H01L 21/67184 118/500 |
| 2002/0081954 | A1 | * | 6/2002 | Mori ...................... B24B 7/228 451/65 |

(Continued)

FOREIGN PATENT DOCUMENTS

| | | | | |
|---|---|---|---|---|
| JP | 2014165434 A | | 9/2014 | |
| JP | 2018069343 A | * | 5/2018 | ......... B24B 27/0023 |

OTHER PUBLICATIONS

Search Report issued by the Intellectual Property Office of Singapore in the counterpart Patent Application No. 10202108475Q, dated Jul. 28, 2022.

(Continued)

*Primary Examiner* — Gerald McClain
(74) *Attorney, Agent, or Firm* — GREER BURNS & CRAIN, LTD.

(57) ABSTRACT

When processing of all the wafers accommodated in a first cassette mounted on a first cassette stage is ended, the last wafer is conveyed out from a holding surface of a chuck table, and the holding surface becomes vacant, the wafer accommodated in a second cassette mounted on a second cassette stage is immediately conveyed onto the holding surface, by control by a conveyance control section. When the wafer to be held by the holding surface is changed from the wafer conveyed out from the first cassette to the wafer conveyed out from the second cassette, processing conditions are changed over to the processing conditions corresponding to the second cassette stage, by changeover control by a changeover section.

10 Claims, 1 Drawing Sheet

(56) References Cited

U.S. PATENT DOCUMENTS

| | | | |
|---|---|---|---|
| 2007/0150085 A1* | 6/2007 | Akiyama | H01L 21/67778 700/112 |
| 2008/0090505 A1* | 4/2008 | Yoshida | B24B 7/228 451/413 |
| 2008/0268752 A1* | 10/2008 | Nemoto | B24B 7/228 451/8 |
| 2009/0186562 A1* | 7/2009 | Kajiyama | B24B 37/042 451/57 |
| 2018/0204746 A1* | 7/2018 | Kuwana | H01L 21/68707 |
| 2019/0351525 A1* | 11/2019 | Fukushi | B24B 49/00 |
| 2021/0260721 A1* | 8/2021 | Fukushi | B24B 51/00 |

OTHER PUBLICATIONS

Written Opinion issued by the Intellectual Property Office of Singapore in the counterpart Patent Application No. 10202108475Q, dated Jul. 28, 2022.

* cited by examiner

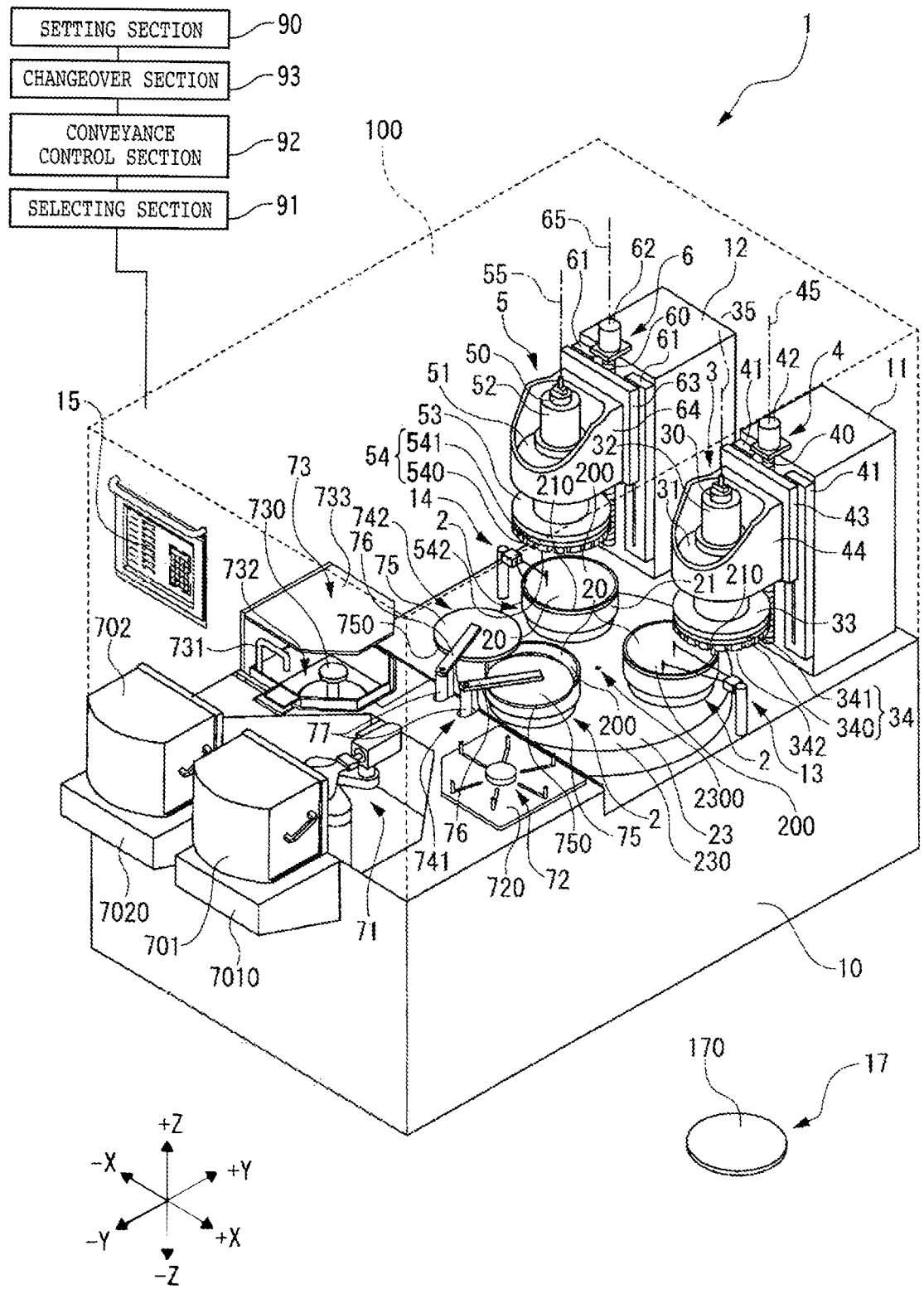

PROCESSING APPARATUS CONFIGURED FOR PROCESSING WAFERS CONTINUOUSLY UNDER DIFFERENT PROCESSING CONDITIONS

BACKGROUND OF THE INVENTION

Field of the Invention

The present invention relates to a processing apparatus.

Description of the Related Art

A grinding apparatus for grinding a wafer has a configuration in which a cassette accommodating wafers on a shelf basis is mounted on a cassette stage, a wafer taken out from the cassette is ground by a grindstone under preset processing conditions, and the ground wafer is accommodated into the cassette.

As a grinding apparatus, there is one in which a plurality of cassette stages such as a first cassette stage and a second cassette stage are disposed, as disclosed in Japanese Patent Laid-open No. 2014-165434. After the wafers accommodated in the cassette mounted on the first cassette stage are ground, the wafers accommodated in the cassette mounted on the second cassette stage are ground under the same processing conditions.

In recent years, there have been cases where, for producing multiple kinds of wafers in small volumes, wafers in a cassette mounted on a first cassette stage and wafers in a cassette mounted on a second cassette stage are ground by a grinding apparatus under different processing conditions. In the case of grinding wafers under different processing conditions, the processing conditions are set in the grinding apparatus, the wafers accommodated in the cassette mounted on the first cassette stage are ground, the ground wafers are all accommodated in the cassette mounted on the first cassette stage, after which the setting of the processing conditions is changed, and the wafers accommodated in the cassette mounted on the second cassette stage are conveyed onto a chuck table and ground.

SUMMARY OF THE INVENTION

Thus, until the setting of the processing conditions is changed, processing of the wafers accommodated in the cassette mounted on the second cassette stage cannot be started. For this reason, for the time until the last wafer accommodated in the cassette mounted on the first cassette stage is ground and conveyed from the chuck table to the cassette and for the time until the first wafer accommodated in the cassette mounted on the second cassette stage is conveyed, the grindstone is made to stand by, so that productivity is low. In addition, when the temperature in the processing chamber lowers during stand-by of the grindstone, the thickness of the wafer would become non-uniform.

Accordingly, it is an object of the present invention to provide a processing apparatus in which a plurality of cassette stages are disposed and which can perform continuous processing without keeping a processing unit in a stand-by state.

In accordance with an aspect of the present invention, there is provided a processing apparatus including a first cassette stage on which a first cassette accommodating a plurality of wafers is mounted; a second cassette stage on which a second cassette accommodating a plurality of wafers is mounted; a chuck table that has a holding surface and holds the wafer on the holding surface; a processing unit that processes the wafer; a conveying-in mechanism that conveys the wafer onto the holding surface of the chuck table; a conveying-out mechanism that conveys out the wafer from the holding surface of the chuck table; a setting section that sets first processing conditions that are used at the time of processing the wafer accommodated in the first cassette mounted on the first cassette stage and second processing conditions that are different from the first processing conditions and that are used at the time of processing the wafer accommodated in the second cassette mounted on the second cassette stage; a selecting section that selects either one of the first cassette stage and the second cassette stage; a conveyance control section that, when processing of all the wafers accommodated in a cassette mounted on a cassette stage, according to processing conditions corresponding to the cassette stage selected by the selecting section, is ended and the last wafer is conveyed out from the holding surface, making the holding surface vacant, immediately conveys the wafer accommodated in the cassette mounted on the other cassette stage onto the holding surface; and a changeover section that, when the wafer to be mounted on the holding surface is changed from the wafer conveyed out from the one cassette stage side to the wafer conveyed out from the other cassette stage side, changes over the processing conditions to the processing conditions corresponding to the other cassette stage.

Preferably, the processing apparatus further includes a turntable on which a plurality of the chuck tables having the holding surfaces are disposed and are disposed to be rotatable between a conveying-in position where the wafer can be conveyed onto the holding surface by the conveying-in mechanism and a processing position where the processing unit processes the wafer held by the holding surface. In the processing apparatus, when processing of the wafers is ended after all the wafers accommodated in the cassette mounted on the one cassette stage are conveyed onto the holding surface and, by conveying out the wafer from the holding surface, one of the plurality of holding surfaces becomes vacant, the conveyance control section immediately conveys the wafer accommodated in the cassette mounted on the other cassette stage onto the vacant holding surface.

In the processing apparatus of the present invention, the first processing conditions and the second processing conditions are preset in the setting section, and, when processing of all the wafers accommodated in the first cassette is ended and the holding surface becomes vacant, the wafer accommodated in the second cassette is automatically conveyed onto the holding surface, under control by the conveyance control section, so that the length of time of stand-by of the processing unit can be reduced. As a result, the length of time required for processing the wafers can be shortened.

In addition, since from which one of the cassette stages the wafer conveyed onto the holding surface comes is managed and processing conditions are thereby changed over, continuous processing of the wafers is possible even where the processing conditions are different on a cassette stage basis.

The above and other objects, features and advantages of the present invention and the manner of realizing them will become more apparent, and the invention itself will best be understood from a study of the following description and appended claims with reference to the attached drawing showing a preferred embodiment of the invention.

BRIEF DESCRIPTION OF THE DRAWING

The FIGURE is a perspective view depicting the whole part of a processing apparatus.

DETAILED DESCRIPTION OF THE PREFERRED EMBODIMENT

1 Configuration of Processing Apparatus

A processing apparatus 1 illustrated in the FIGURE is a processing apparatus that processes a wafer 17 held by any one of three chuck tables 2 by use of a first processing unit 3 and a second processing unit 5. A configuration of the processing apparatus 1 will be described below. The processing apparatus 1 includes a base 10 extended in a Y-axis direction as depicted in the FIGURE. A first column 11 is erected on a +Y direction side and on a +X direction side of the base 10, and a second column 12 is erected on a −X direction side of the first column 11. In addition, the processing apparatus 1 includes a housing cover 100, and various members of the processing apparatus 1 are covered by the housing cover 100.

A first cassette stage 7010 is disposed on a −Y direction side and on the +X direction side of the base 10, and a second cassette stage 7020 is disposed on the −X direction side of the first cassette stage 7010. A first cassette 701 is mounted on the first cassette stage 7010. The first cassette 701 includes a plurality of unillustrated shelves for accommodating wafers 17, and, for example, a plurality of wafers 17 that have not yet been processed are accommodated on a shelf basis in the first cassette 701. A second cassette 702 is mounted on the second cassette stage 7020. The second cassette 702 includes a plurality of unillustrated shelves for accommodating the wafers 17, and, for example, a plurality of wafers 17 that have not yet been processed are accommodated on a shelf basis in the second cassette 702.

A robot 71 is disposed on the +Y direction side of the first cassette 701. The robot 71 is used to draw out and covey the wafer 17 accommodated in the first cassette 701 to a temporary placing region 720. In addition, the robot 71 is used to draw out and covey the wafer 17 accommodated in the second cassette 702 to the temporary placing region 720.

Besides, the robot 71 can accommodate the wafer 17 that has been processed into either one of the first cassette 701 and the second cassette 702. For example, the wafer 17 drawn out from the first cassette 701 by the robot 71 and processed is accommodated into the first cassette 701 after processing. On the other hand, the wafer 17 drawn out from the second cassette 702 by the robot 71 and processed is accommodated into the second cassette 702 after processing.

The temporary placing region 720 where the wafer 17 that has not yet been processed is temporarily placed is provided on the +X direction side in a movable region of the robot 71, and a cleaning region 732 where the wafer 17 that has been processed is cleaned is provided on the −X direction side in the movable region of the robot 71.

An aligning mechanism 72 is disposed at the temporary placing region 720. The wafer 17 conveyed out from the cassette 70 and placed in the temporary placing region 720 is aligned to be placed at a predetermined position by the aligning mechanism 72.

A spinner cleaning unit 73 is disposed in the cleaning region 732. The spinner cleaning unit 73 includes a spinner table 730 by which the wafer 17 is held and a cleaning water supply nozzle 731 that jets cleaning water toward the wafer 17 held by the spinner table 730. For example, in a state in which the wafer 17 that has been processed is held on an upper surface of the spinner table 730, cleaning water is supplied from the cleaning water supply nozzle 731 while the spinner table 730 is rotated, whereby the wafer 17 can be cleaned. In addition, a waterproof cover 733 for preventing the cleaning water supplied from the cleaning water supply nozzle 731 from scattering to the surroundings of the cleaning region 732 is provided on an upper side of the spinner table 730.

At a position adjacent to the temporary placing region 720, a conveying-in mechanism 741 that conveys the wafer 17 aligned by use of the aligning mechanism 72 at the temporary placing region 720 onto any one of the three chuck tables 2 is disposed. The conveying-in mechanism 741 includes a disk-shaped conveying pad 75 and an arm 76 suspending the conveying pad 75. The conveying pad 75 is connected to an unillustrated suction source, and the wafer 17 can be held under suction on a holding surface 750 which is a lower surface of the conveying pad 75.

In addition, a shaft section 77 is connected to an end portion of the arm 76, and an unillustrated rotating mechanism that rotates the shaft section 77 around an axis in the Z-axis direction is connected to the shaft section 77. By rotating the shaft section 77 with use of the rotating mechanism, the arm 76 connected to the shaft section 77 can be swiveled, and the conveying pad 75 can be moved horizontally. Further, an unillustrated lift mechanism is disposed on the shaft section 77. The shaft section 77 is lifted up or down in the Z-axis direction by use of the lift mechanism, whereby the arm 76 and the conveying pad 75 are lifted up or down as one body in the Z-axis direction.

For example, in a state in which the wafer 17 is placed in the temporary placing region 720, the arm 76 is swiveled to position the conveying pad 75 directly above the wafer 17 temporarily placed in the temporary placing region 720 and is lowered, after which the suction source is operated, whereby the wafer 17 can be held under suction by the conveying pad 75. Then, in a state in which the wafer 17 is held under suction by the conveying pad 75, the arm 76 is swiveled to position the wafer 17 held under suction by the conveying pad 75 on the upper side of the chuck table 2, after which the conveying pad 75 is lowered, and the suction force acting on the conveying pad 75 is released, whereby the wafer 17 can be conveyed onto the chuck table 2.

On the −X direction side of the conveying-in mechanism 741, a conveying-out mechanism 742 that conveys out, from the chuck table 2, the wafer 17 that has been processed is disposed. The conveying-out mechanism 742 is configured similarly to the conveying-in mechanism 741, and, thus, the conveying-out mechanism 742 is denoted by a symbol similar to that of the conveying-in mechanism 741.

For example, the wafer 17 that has been processed is held under suction by the conveying pad 75, and the arm 76 is swiveled, to position the wafer 17 held under suction by the conveying pad 75 on an upper surface of the spinner table 730, after which the conveying pad 75 is lowered, and the suction force acting on the conveying pad 75 is cancelled, whereby the wafer 17 can be conveyed out from the holding surface 200 to the cleaning region 732.

A disk-shaped turntable 23 is disposed on the +Y direction side on the base 10. The three chuck tables 2 are disposed on the upper surface 230 of the turntable 23 at regular intervals in the circumferential direction. The turntable 23 is connected to an unillustrated rotating mechanism, and is rotatable around an axis in the Z-axis direction which passes through a center 2300 of the turntable 23 by use of the rotating mechanism.

The three chuck tables 2 are disk shaped. The three chuck tables 2 each include a suction section 20 and a frame body 21 supporting the suction section 20. An upper surface of the suction section 20 is a holding surface 200 on which the wafer 17 is held, and an upper surface 210 of the frame body 21 is formed flush with the holding surface 200.

The suction section 20 is connected to an unillustrated suction source. For example, by transmitting a suction force generated by the suction source to the suction section 20 in a state in which the wafer 17 is mounted on the holding surface 200, the wafer 17 can be held under suction on the holding surface 200.

In addition, unillustrated pressure monitor means that measures the magnitude of pressure on the holding surface 200 is connected to the holding surface 200. In the pressure monitor means, in a state in which the suction source is operating, different pressures are measured when the wafer 17 is held under suction on the holding surface 200 and when nothing is held on the holding surface 200.

In addition, each of the chuck tables 2 is connected to an unillustrated rotating mechanism. By use of the rotating mechanism, the chuck table 2 can be rotated around an axis in the Z-axis direction which passes through the center of the holding surface 200.

By rotating the turntable 23, the three chuck tables 2 disposed on the turntable 23 can be revolved around the center 2300 of the turntable 23. By revolving the chuck tables 2 by use of the turntable 23, each of the three chuck tables 2 can be positioned at a first processing position which is a horizontal position on a lower side of the first processing unit 3, a second processing position which is a horizontal position on a lower side of the second processing unit 5, and a conveying-in position which is a horizontal position at the time of conveying the wafer 17 onto the holding surface 200 by use of the conveying-in mechanism 741 (also a conveying-out position at the time of conveying out the wafer 17 by use of the conveying-out mechanism 742).

Here, the first processing position is a horizontal position of the chuck table 2 at the time of rough grinding of the wafer 17 by use of the first processing unit 3, and the second processing position is a horizontal position of the chuck table 2 at the time of finish grinding of the wafer 17 by use of the second processing unit 5. For example, when one of the three chuck tables 2 is positioned at the first processing position, the other two chuck tables 2 are respectively positioned at the second processing position and the conveying-in position.

On a side surface on the −Y direction side of the first column 11, a first processing feeding mechanism 4 supporting the first processing unit 3 in an upwardly and downwardly liftable manner is disposed. The first processing feeding mechanism 4 includes a ball screw 40 having a rotational axis 45 in the Z-axis direction, a pair of guide rails 41 disposed in parallel to the ball screw 40, a Z-axis motor 42 that rotates the ball screw 40 around the rotational axis 45, a lift plate 43 having a nut inside and in screw engagement with the ball screw 40 and having side portions in sliding contact with the guide rails 41, and a holder 44 that is connected to the lift plate 43 and that supports the first processing unit 3.

When the ball screw 40 is driven by the Z-axis motor 42 and the ball screw 40 is rotated around the rotational axis 45, the lift plate 43 is attendantly lifted upward or downward in the Z-axis direction while being guided by the guide rails 41, and the first processing unit 3 is lifted upward or downward in the Z-axis direction.

The first processing unit 3 is, for example, a rough grinding unit which includes a spindle 30 having a rotational axis in the Z-axis direction, a housing 31 that supports the spindle 30 in a rotatable manner, a spindle motor 32 that drives, in a rotational manner, the spindle 30 around the rotational axis 35, a mount 33 connected to a lower end of the spindle 30, and a rough grinding wheel 34 detachably mounted to a lower surface of the mount 33. The rough grinding wheel 34 includes a wheel base 341 and a plurality of substantially rectangular parallelepiped rough grindstones 340 arranged in an annular pattern on a lower surface of the wheel base 341. Lower surfaces 342 of the rough grindstones 340 are grinding surfaces making contact with an upper surface 170 of the wafer 17.

When the spindle 30 is rotated by use of the spindle motor 32, the mount 33 connected to the spindle 30 and the rough grinding wheel 34 mounted to the lower surface of the mount 33 are rotated as one body.

A first thickness measuring unit 13 is disposed in the vicinity of the first processing unit 3 on the base 10. The first thickness measuring unit 13 has, for example, a contact type height gauge or the like, and can measure the thickness of the wafer 17 by putting the height gauge into contact with the upper surface 170 of the wafer 17 held on the holding surface 200 and the upper surface 210 of the frame body 21 and measuring the difference in height between them, during rough grinding of the wafer 17.

On a side surface on the −Y direction side of the second column 12, a second processing feeding mechanism 6 that supports the second processing unit 5 liftably upward and downward is disposed. The second processing feeding mechanism 6 includes a ball screw 60 having a rotational axis 65 in the Z-axis direction, a pair of guide rails 61 disposed in parallel to the ball screw 60, a Z-axis motor 62 that rotates the ball screw 60 around the rotational axis 65, a lift plate 63 having a nut inside and in screw engagement with the ball screw 60 and having side portions in sliding contact with the guide rails 61, and a holder 64 that is connected to the lift plate 63 and supports the second processing unit 5.

When the ball screw 60 is driven by the Z-axis motor 62 and is rotated around the rotational axis 65, the lift plate 63 is attendantly lifted upward or downward while being guided by the guide rails 61, and the second processing unit 5 held by the holder 64 is lifted upward or downward in the Z-axis direction.

The second processing unit 5 is, for example, a finish grinding unit which includes a spindle 50 having a rotational axis 55 in the Z-axis direction, a housing 51 that supports the spindle 50 in a rotatable manner, a spindle motor 52 that drives, in a rotational manner, the spindle 50 around the rotational axis 55, a mount 53 connected to a lower end of the spindle 50, and a finish grinding wheel 54 detachably mounted to a lower surface of the mount 53.

The finish grinding wheel 54 includes a wheel base 541 and a plurality of substantially rectangular parallelepiped finish grindstones 540 arranged in an annular pattern on a lower surface of the wheel base 541. Here, abrasive grains of the finish grindstones 540 are finer than the abrasive grains of the rough grindstones 340. Lower surfaces 542 of the finish grindstones 540 are grinding surfaces making contact with the upper surface 170 of the wafer 17.

When the spindle 50 is rotated by use of the spindle motor 52, the mount 53 connected to the spindle 50 and the finish grinding wheel 54 mounted to the lower surface of the mount 53 are rotated as one body.

In the vicinity of the second processing unit 5 on the base 10, a second thickness measuring unit 14 is disposed. The second thickness measuring unit 14 includes, for example, a contact type height gauge or the like, similarly to the first thickness measuring unit 13. The thickness of the wafer 17 can be measured by putting the height gauge into contact with the upper surface 170 of the wafer 17 held by the holding surface 200 and the upper surface 210 of the frame body 21 and measuring the difference in height between them, during finish grinding of the wafer 17.

The processing apparatus 1 includes a setting section 90 that sets first processing conditions for processing the wafer 17 accommodated in the first cassette 701 mounted on the first cassette stage 7010 and second processing conditions for processing the wafer 17 accommodated in the second cassette 702 mounted on the second cassette stage 7020. The setting section 90 includes, for example, a storage element such as a memory, which has a region for storing the first processing conditions and a region for storing the second processing conditions. The first processing conditions and the second processing conditions are different processing conditions. A touch panel 15 is provided on a side surface on the −Y direction side of the housing cover 100 of the processing apparatus 1, and the touch panel 15 is electrically connected to the setting section 90. For example, by touching the touch panel 15 to set the processing conditions, the set processing conditions are stored in the setting section 90.

In addition, the processing apparatus 1 includes a selecting section 91 that selects either one of the first cassette stage 7010 and the second cassette stage 7020. The processing apparatus 1 includes a conveyance control section 92 that, when processing of all the wafers accommodated in either one of the first cassette 701 mounted on the first cassette stage 7010 and the second cassette 702 mounted on the second cassette stage 7020 which is selected by the selecting section 91 is ended and the last wafer 17 is conveyed out from the holding surface 200, making the holding surface 200 vacant, performs control to immediately convey in the wafer 17 accommodated in the other cassette onto the holding surface 200.

The abovementioned unillustrated pressure monitor means is electrically connected to the conveyance control section 92. In addition, unillustrated recognition means that recognizes the number of the wafers 17 preliminarily stored in the first cassette 701 and an unillustrated counter that counts the number of wafers 17 drawn out from the first cassette 701 and processed are connected to the conveyance control section 92. The counter has, for example, a function of counting up each time the pressure on the holding surface 200 changes when the wafer 17 is conveyed out from the holding surface 200.

In the conveyance control section 92, the timing when the processing of the last wafer 17 is to be ended is recognized based on the number of the wafers 17 preliminarily accommodated in the first cassette 701 which is recognized by the recognition means and the number of the processed wafers 17 which is counted by the counter. When the last wafer 17 is conveyed out from the holding surface 200 and the holding surface 200 becomes vacant, such vacancy is recognized by a change in the pressure being monitored by the pressure monitor means, and is transmitted as an electrical signal to the conveyance control section 92.

Vacancy of the holding surface 200 may be recognized when the number of the wafers 17 preliminarily accommodated in the first cassette 701 which is recognized by the recognition means and the number of the processed wafers 17 which is counted by the counter match with each other.

In addition, the pressure monitor means and the counter may be disposed at the conveying-out mechanism 742 that conveys out the wafer 17 from the holding surface, the counter may be caused to count up by a change in the pressure detected by the pressure monitor means when the wafer 17 is held by the conveying-out mechanism 742, and the vacancy of the holding surface 200 may be recognized when the counted-up value matches the number of the wafers 17 that had been accommodated in the first cassette 701.

Further, the processing apparatus 1 includes a changeover section 93 that, when the wafer 17 held by the holding surface 200 is changed over from the wafer 17 conveyed in from either one of the first cassette stage 7010 and the second cassette stage 7020 to the wafer 17 conveyed in from the other cassette stage, changes over the processing conditions to the processing conditions corresponding to the other cassette stage. The changeover section 93 reads either of the first processing conditions and the second processing conditions from the setting section 90 and uses the read processing conditions for control of the processing apparatus 1.

2 Operation of Processing Apparatus

An operation of the processing apparatus 1 when processing the wafer 17 by use of the processing apparatus 1 will be described. As an order of processing, for example, a case where all the wafers 17 accommodated in the first cassette 701 are first processed and then the wafers 17 accommodated in the second cassette 702 are processed will be described as an example.

To process the wafers 17 accommodated in the first cassette 701 by use of the processing apparatus 1, first, the first cassette stage 7010 is selected by the selecting section 91. As a result, the first processing conditions set in the setting section 90 as processing conditions corresponding to the first cassette stage 7010 are read out. The first processing conditions include, for example, rotational speeds of the rough grindstones 340 and the finish grindstone 540 and processing feeding speeds of both the grindstones.

Then, one of the plurality of wafers 17 accommodated in the first cassette 701 is drawn out and placed in the temporary placing region 720 by use of the robot 71, and is subjected to alignment by use of the aligning mechanism 72.

In addition, the turntable 23 is rotated, whereby one of the three chuck tables 2 disposed on the turntable 23 is positioned at the conveying-in position of the wafer 17. In a state in which one of the three chuck tables 2 is positioned at the conveying-in position, the wafer 17 placed in the temporary placing region 720 is conveyed onto the holding surface 200 of the chuck table 2 positioned at the conveying-in position, by use of the conveying-in mechanism 741. Next, in a state in which the wafer 17 is mounted on the holding surface 200, the unillustrated suction source is operated, whereby the suction force generated is transmitted to the holding surface 200, and the wafer 17 is held under suction on the holding surface 200.

Subsequently, the turntable 23 is, for example, rotated counterclockwise by 120 degrees, whereby the chuck table 2 with the wafer 17 held on the holding surface 200 thereof is moved to a position on a lower side of the first processing unit 3. As a result, the chuck table 2 with the wafer 17 held on the holding surface 200 thereof is positioned at the first processing position.

In addition, the wafer 17 held on the holding surface 200 of the chuck table 2 is rotated by an unillustrated rotating mechanism, and the rough grindstones 340 are preliminarily rotated around the rotational axis 35 by use of the spindle motor 32.

In a state in which the wafer 17 held by the holding surface 200 and the rough grindstones 340 are being rotated, the rough grindstones 340 are lowered in the −Z direction by use of the first processing feeding mechanism 4. As a result, the lower surfaces 342 of the rough grindstones 340 are brought into contact with the upper surface 170 of the wafer 17.

In a state in which the lower surfaces 342 of the rough grindstones 340 are in contact with the upper surface 170 of the wafer 17, the rough grindstones 340 are gradually further lowered in the −Z direction by use of the first processing feeding mechanism 4, whereby the wafer 17 is rough-ground. During the rough grinding of the wafer 17, measurement of thickness of the wafer 17 by use of the first thickness measuring unit 13 is conducted. When the wafer 17 is ground to a predetermined thickness, the rough grinding of the wafer 17 is ended.

After the rough grinding of the wafer 17 is ended, the rough grindstones 340 are raised in the +Z direction by use of the first processing feeding mechanism 4, whereby the rough grindstones 340 are separated away from the upper surface 170 of the wafer 17.

Then, the turntable 23 is, for example, rotated counterclockwise by 120 degrees, whereby the chuck table 2 with the wafer 17 that has been rough-ground held thereon is moved to a position on a lower side of the second processing unit 5. As a result, the chuck table 2 with the wafer 17 that has been rough-ground held thereon is positioned at the second processing position.

In addition, the finish grindstones 540 are preliminarily rotated around the rotational axis 55 by use of the spindle motor 52. In a state in which the wafer 17 held on the holding surface 200 and the finish grindstones 540 are being rotated, the finish grindstones 540 are lowered in the −Z direction by use of the second processing feeding mechanism 6, whereby the lower surfaces 542 of the finish grindstones 540 are brought into contact with the upper surface 170 of the wafer 17. In a state in which the lower surfaces 542 of the finish grindstones 540 are in contact with the upper surface 170 of the wafer 17, the finish grindstones 540 are further lowered in the −Z direction by use of the second processing feeding mechanism 6, whereby the wafer 17 is finish-ground.

During the finish grinding of the wafer 17, measurement of thickness of the wafer 17 by use of the second thickness measuring unit 14 is conducted. When the wafer 17 is finish-ground to a predetermined thickness, the finish grinding of the wafer 17 is ended. After the finish grinding of the wafer 17 is ended, the finish grindstones 540 are raised in the +Z direction by use of the second processing feeding mechanism 6, whereby the finish grindstones 540 are separated away from the upper surface 170 of the wafer 17.

Then, the turntable 23 is, for example, rotated counterclockwise by 120 degrees, whereby the chuck table 2 with the wafer 17 that has been finish-ground held thereon is positioned in the conveying-out region (the same as the conveying-in region). In a state in which the chuck table 2 with the wafer 17 that has been finish-ground held thereon is positioned in the conveying-out region, the wafer 17 is conveyed out from the holding surface 200 onto the spinner table 730 by use of the conveying-out mechanism 742.

Then, in a state in which the wafer 17 is held on the spinner table 730, cleaning water is jetted from a cleaning water supply nozzle 731 while the spinner table 730 is rotated, whereby the upper surface 170 of the wafer 17 is cleaned with running water. After the cleaning of the upper surface 170 of the wafer 17 with running water, the wafer 17 is accommodated into the first cassette 701 by use of the robot 71.

In the abovementioned series of processing processes, immediately after the chuck table 2 with the wafer 17 held thereon is moved to a position on a lower side of the first processing unit 3, the wafer 17 as a next workpiece to be processed is conveyed onto the chuck table 2 positioned at the conveying-in position at that time. Thus, the wafers 17 accommodated in the first cassette 701 are drawn out one after another, and sequentially subjected to the rough grinding by use of the first processing unit 3 and the finish grinding by use of the second processing unit 5. The number of the wafers 17 accommodated in the first cassette 701 is preliminarily recognized, and the number of the wafers 17 rough-ground and finish-ground is counted.

Then, when the finish grinding of the last wafer 17 that is among the wafers 17 preliminarily accommodated in the first cassette 701 is ended and the last wafer 17 is conveyed out from the holding surface 200 of the chuck table 2 by the conveying-out mechanism 742, the holding surface 200 of the chuck table 2 becomes vacant.

Here, the unillustrated pressure monitor means is connected to the holding surface 200 as described above, and a change in the magnitude of the suction force on the holding surface 200 is being monitored. Upon a change from a state in which the last wafer 17 is held under suction on the holding surface 200 to a state in which the last wafer 17 has been conveyed out from the holding surface 200 by the conveying-out mechanism 742 and nothing is held on the holding surface 200, the magnitude of the suction force on the holding surface 200 changes. The change in pressure is transmitted as an electrical signal to the conveyance control section 92.

When the electrical signal is transmitted to the conveyance control section 92, the second cassette stage 7020 is selected by the selecting section 91. Then, in response to control of operation by the conveyance control section 92, the wafer 17 accommodated in the second cassette 702 mounted on the second cassette stage 7020 is drawn out by the robot 71, and is placed in the temporary placing region 720. Then, alignment of the wafer 17 by use of the aligning mechanism 72 is conducted.

After the alignment of the wafer 17 is performed, in a state in which the chuck table 2 is preliminarily positioned in the conveying-in region, the wafer 17 is conveyed onto the chuck table 2 by use of the conveying-in mechanism 741. Here, when the wafer 17 to be held on the holding surface 200 is changed over from the wafer 17 accommodated in the first cassette 701 placed on the first cassette stage 7010 to the wafer 17 accommodated in the second cassette 702 placed on the second cassette stage 7020, the second processing conditions are read out from the setting section 90, and processing conditions are changed over by the changeover section 93 from the first processing conditions into the second processing conditions which are processing conditions corresponding to the second cassette stage 7020.

Thereafter, the wafer 17 is rough-ground by use of the first processing unit 3 and then finish-ground by use of the second processing unit 5 similarly to the abovementioned manner, and the wafer 17 is conveyed out from the holding surface 200 onto the spinner table 730 by use of the conveying-out mechanism 742, followed by cleaning the upper surface 170 of the wafer 17 with running water by use of the spinner cleaning unit 73 and accommodating the wafer 17 into the second cassette 702 by use of the robot 71.

Further, the wafers 17 accommodated in the second cassette 702 are drawn out one after another, and are sequentially subjected to rough grinding by use of the first processing unit 3 and finish grinding by use of the second processing unit 5, whereby all the wafers 17 preliminarily accommodated in the second cassette 702 are processed.

In the processing according to the prior art, after processing of the wafers 17 in one processing condition is ended, a new processing condition is set for processing the wafers 17 in another processing condition, which has been a bottle neck. On the other hand, in the processing apparatus 1, first processing conditions and second processing conditions are preliminarily set in the setting section 90, and, when processing of all the wafers 17 accommodated in the first cassette 701 is ended and the holding surface 200 becomes vacant, the wafers 17 accommodated in the second cassette 702 are automatically conveyed onto the holding surface 200, under control by use of the conveyance control section 92, so that the length of waiting time of the first processing unit 3 and the second processing unit 5 can be reduced. Accordingly, the length of time required for processing the wafers 17 can be shortened.

In addition, since from which one of the cassette stages the wafer 17 conveyed onto the holding surface 200 comes is managed and processing conditions are thereby changed over by the changeover section 93, continuous processing of the wafers 17 is possible even where the processing conditions are different on a cassette stage basis.

Note that the processing apparatus 1 is not limited to the grinding apparatus for grinding the wafers 17 as describe above and may be a polishing apparatus for polishing the wafers 17 or a cutting apparatus for cutting the wafers 17.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method for processing wafers with a processing apparatus where the processing apparatus includes a first cassette stage on which a first cassette accommodating a plurality of wafers is mounted; a second cassette stage on which a second cassette accommodating a plurality of wafers is mounted; a chuck table that has a holding surface and holds the wafer on the holding surface; a processing unit that processes the wafer; a conveying-in mechanism that conveys the wafer onto the holding surface of the chuck table; and a conveying-out mechanism that conveys out the wafer from the holding surface of the chuck table; and wherein the method comprises:
    a setting step of setting into a memory first processing conditions that are used at the time of processing the wafers accommodated in the first cassette mounted on the first cassette stage and second processing conditions that are different from the first processing conditions and that are used at the time of processing the wafers accommodated in the second cassette mounted on the second cassette stage;
    a selecting step of selecting either one of the first cassette stage and the second cassette stage;
    a step of processing the wafers from the cassette mounted on the cassette stage selected during the selecting step, one by one, in the processing unit, wherein during processing, the wafer is held on the holding surface of the chuck table;
    a conveyance controlling step that is performed after completing the processing step on all the wafers accommodated in the cassette mounted on the cassette stage selected during the selecting step, according to processing conditions corresponding to the cassette stage selected during the selecting step, and the last wafer has been conveyed out from the holding surface, thereby making the holding surface vacant, wherein the conveyance controlling step includes controlling the conveying-in mechanism to convey a first one of the wafers accommodated in a cassette mounted on the other cassette stage onto the holding surface before the last wafer from the cassette mounted on the cassette stage selected during the selecting step is again accommodated in the cassette mounted on the cassette stage selected during the selecting step; and
    a changeover step that is performed as the wafer to be mounted on the holding surface is changed from the last wafer conveyed out from the one cassette stage side to the first wafer conveyed out from the other cassette stage side, wherein the changeover step includes changing over the processing conditions to the processing conditions corresponding to the other cassette stage.

2. The processing method according to claim 1, wherein the processing apparatus further includes a turntable on which a plurality of the chuck tables having the holding surfaces are disposed, and are disposed to be rotatable between a conveying-in position where the wafer can be conveyed onto the holding surface by the conveying-in mechanism and a processing position where the processing unit processes the wafer held by the holding surface, and wherein:
    the changeover step is performed when one of the plurality of holding surfaces becomes vacant.

3. The processing method according to claim 1, wherein the processing unit comprises a grinding apparatus and the first processing conditions and the second processing conditions both relate to processing by grinding.

4. The processing method according to claim 3, wherein:
    the grinding apparatus includes at least one grinding wheel with a plurality of grindstones attached to a bottom surface thereof, and further wherein the grinding wheel is configured and arranged to be rotated and to be moved such that the grindstones are made to contact the wafer being processed by the processing unit,
    the first processing conditions include a first rotating speed of the grinding wheel, and
    the second processing conditions include a second rotating speed of the grinding wheel.

5. The processing method according to claim 3, wherein:
    the grinding apparatus includes at least one grinding wheel with a plurality of grindstones attached to a bottom surface thereof, and further wherein the grinding wheel is configured and arranged to be rotated and to be moved such that the grindstones are made to contact the wafer being processed by the processing unit,
    the first processing conditions include a first feeding speed for feeding the grinding wheel toward the wafer being processed by the processing unit, and
    the second processing conditions include a second feeding speed for feeding the grinding wheel toward the wafer being processed by the processing unit.

6. The processing method according to claim 3, wherein: the grinding apparatus includes:
    a rough grinding wheel with a plurality of rough grindstones attached to a bottom surface thereof, and further wherein the rough grinding wheel is configured and arranged to be rotated and to be moved such that the rough grindstones are made to contact the wafer being processed by the processing unit, and
a finish grinding wheel with a plurality of finish grindstones attached to a bottom surface thereof, and further wherein the finish grinding wheel is configured and arranged to be rotated and to be moved such that the rough grindstones are made to contact the wafer being processed by the processing unit, and
the first processing conditions include a first rotating speed of the rough grinding wheel and a first rotating speed of the finish grinding wheel, and
the second processing conditions include a second rotating speed of the rough grinding wheel and a second rotating speed of the finish grinding wheel.

7. The processing method according to claim 3, wherein:
the grinding apparatus includes:
a rough grinding wheel with a plurality of rough grindstones attached to a bottom surface thereof, and further wherein the rough grinding wheel is configured and arranged to be rotated and to be moved such that the rough grindstones are made to contact the wafer being processed by the processing unit, and
a finish grinding wheel with a plurality of finish grindstones attached to a bottom surface thereof, and further wherein the finish grinding wheel is configured and arranged to be rotated and to be moved such that the rough grindstones are made to contact the wafer being processed by the processing unit, and
the first processing conditions include a first feeding speed for feeding the rough grinding wheel toward the wafer being processed by the processing unit and a first feeding speed for feeding the finish grinding wheel toward the wafer being processed by the processing unit, and
the second processing conditions include a second feeding speed for feeding the rough grinding wheel toward the wafer being processed by the processing unit and a second feeding speed for feeding the finish grinding wheel toward the wafer being processed by the processing unit.

8. The processing method according to claim 1, wherein the processing unit comprises a polishing apparatus and the first processing conditions and the second processing conditions both relate to processing by polishing.

9. The processing method according to claim 1, wherein the processing unit comprises a cutting apparatus and the first processing conditions and the second processing conditions both relate to processing by cutting.

10. The processing method according to claim 1, wherein during the conveyance controlling step, a determination that the holding surface is vacant is based on a change in the magnitude of a suction force on the holding surface.

* * * * *